(12) United States Patent
Chen

(10) Patent No.: US 6,720,623 B2
(45) Date of Patent: Apr. 13, 2004

(54) ESD PROTECTION DEVICE COUPLED BETWEEN TWO HIGH POWER LINES

(75) Inventor: Wei-Fan Chen, Taichung (TW)

(73) Assignees: Winbond Electronics Corp., Hsinchu (TW); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/395,769

(22) Filed: Mar. 24, 2003

(65) Prior Publication Data

US 2004/0016970 A1 Jan. 29, 2004

(30) Foreign Application Priority Data

Jul. 25, 2002 (TW) .......................... 9116549 A

(51) Int. Cl.[7] .............................. H01L 23/62
(52) U.S. Cl. .................. 257/355; 257/357; 257/365
(58) Field of Search ................. 257/355, 356, 257/357, 360, 361, 365

(56) References Cited

U.S. PATENT DOCUMENTS

| 5,181,091 A | * | 1/1993 | Harrington, III et al. ... 257/355 |
| 5,182,220 A | * | 1/1993 | Ker et al. .................... 438/200 |
| 5,581,103 A | * | 12/1996 | Mizukami .................... 257/355 |

* cited by examiner

*Primary Examiner*—Phat X. Cao
*Assistant Examiner*—Theresa T. Doan
(74) *Attorney, Agent, or Firm*—Birch, Stewart, Kolasch & Birch, LLP

(57) ABSTRACT

An ESD protection device coupled between two high power lines. The ESD protection device comprises a N-type well and a P-type well adjacent to each other, and a pair of PN MOS. The N-type well is coupled to a first high power line, and the P-type well is coupled to a low power line. The pair of PN MOS comprises a PMOS and a NMOS, formed respectively in the N-type well and P-type well. The PMOS and the NMOS is connected as an inverter powered by the first high power line and a second power line and to ensure that, in normal operation, either the PMOS or the NMOS is turned off.

9 Claims, 7 Drawing Sheets

ESD PROTECTION DEVICE COUPLED BETWEEN TWO HIGH POWER LINES

BACKGROUND OF THE INVENTION

1. Field of the Invention

The present invention relates to an ESD (electrostatic discharge) protection device, and particularly to an ESD protection device coupled between two high power lines.

2. Description of the Prior Art

As the technology of manufacturing ICs (integrated circuits) advances, the elements in the ICs are more susceptible to outside surroundings and tend to be damaged, especially in an ESD event. In order to protect the ICs from being damaged by an ESD current, ESD protection devices have to be installed in the ICs. Before the elements inside the ICs are damaged by an ESD stress, the ESD protection devices must be timely triggered and conduct the ESD current so as to protect the elements in the ICs.

During IC designing, not only the ESD event accross an I/O port and a power line, but also the ESD event across every two pins of the ICs has to be considered.

In the present design, due to the consideration of noise separation or operation speed, different circuit groups of the ICs may be powered by different power lines from different power sources. For example, I/O circuits are powered by power lines of 3.3 Volt, but core circuits are powered by the power lines of 1.8 Volt. Without adequate ESD protection design between two power lines for different power source, ESD current might damage the interface circuits between the two circuit groups operating with different voltages.

FIG. 1 is a perspective diagram of a prior art ESD protecting system. VDD1 and VSS1 represent a pair of power lines, and VDD2 and VSS2 represent another pair of power lines. Different pairs provide power to different circuits. An ESD_pass circuit 8 is coupled between VDD1 and VDD2, and another ESD_pass circuit 8 is coupled between VSS1 and VSS2. Each of the ESD_pass circuits has to be turned off in normal operation. When an ESD event occurs or the difference between the voltages at two ends is great enough, the ESD_pass circuit will be turned on and current will pass through therein.

The ESD_pass circuit of FIG. 1 is consisiting of two diodes, in which the cathode of one diode is connected to the anode of the other diode. When the voltage difference between the two ends of the ESD_pass circuit is less than a turn-on voltage of a diode in the ESD_pass circuit, the ESD_pass circuit will be turned off, acting as an open circuit. In contrast, when the voltage difference between the two ends of the ESD_pass circuit is greater than the turn-on voltage, the ESD_pass circuit will be turned on, acting as a short circuit to pass current. Choosing the turn-on voltage of the diode depends on the acceptable voltage difference across the two ends of the ESD_pass circuit in normal operation. The greater the acceptable voltage difference is, the greater the turn-on voltage of a diode in the ESD_pass circuit must be. An equivalent diode with a higher turn-on voltage is composed of a number of diodes connected in series. Generally speaking, the turn-on voltage for a single diode fabricated by silicon process is about 0.7 Volt.

However, in the semiconductor manufacturing process, the area required by a single diode is considerable; let alone a plurality of diodes are connected in series. Therefore, in the ESD protecting system of FIG. 1, a considered area on the wafer might be required and increases the cost.

SUMMARY OF THE INVENTION

Therefore, the objective of the present invention is to provide an ESD protection device occupying a small area on the wafer and being capable of isolating two power lines. During an ESD event, the two power lines are connected and have low impedances.

According to the present invention, an ESD protection device is coupled between a first high power line and a second high power line. The ESD protection device comprises a N-type well and a P-type well adjacent to each other, and a pair of PN MOS. The N-type well is coupled to the first high power line, and the P-type well is coupled to a low power line. The pair of PN MOS comprises a P-type metal-oxide-semiconductor transistor (PMOS) and a N-type metal-oxide-semiconductor transistor (NMOS). The PMOS is installed in the N-type well, and comprises a first gate structure, a first P-type doped area and a second P-type doped area. The first gate structure is a gate of the PMOS. The first P-type doped area is coupled to the first high power line. The NMOS is installed in the P-type well, and comprises a second gate structure, a first N-type doped area and a second N-type doped area. The second gate structure is a gate of the NMOS. The gate of the NMOS is coupled to the gate of the PMOS to form an input end of the pair of PN MOS. The second P-type doped area is coupled to the second N-type doped area to form an output end of the pair of PN MOS. The first N-type doped area is coupled to the second high power line. In normal operation, either the PMOS or the NMOS is turned off.

The advantage of the invention is that in the pair of the PN MOS, a parasitical silicon controlled rectifier (SCR) is formed and coupled between the first and the second high power lines. In an ESD event, the equivalent resistance of a turned-on SCR is considerably low, and therefore, the SCR can be a well-functioned ESD protection device. Furthermore, the trigger voltage (or the turn-on voltage) of the SCR is adjustable in a layout manner. When a high trigger voltage is needed, the area occupied by the SCR is much smaller than that occupied by the plurality of diodes connected in series. Therefore, the cost of the wafer will be reduced.

These and other objectives of the present invention will no doubt become obvious to those of ordinary skill in the art after having read the following detailed description of the preferred embodiment, which is illustrated in the various figures and drawings.

DETAILED DESCRIPTION OF THE INVENTION

Figure 2:
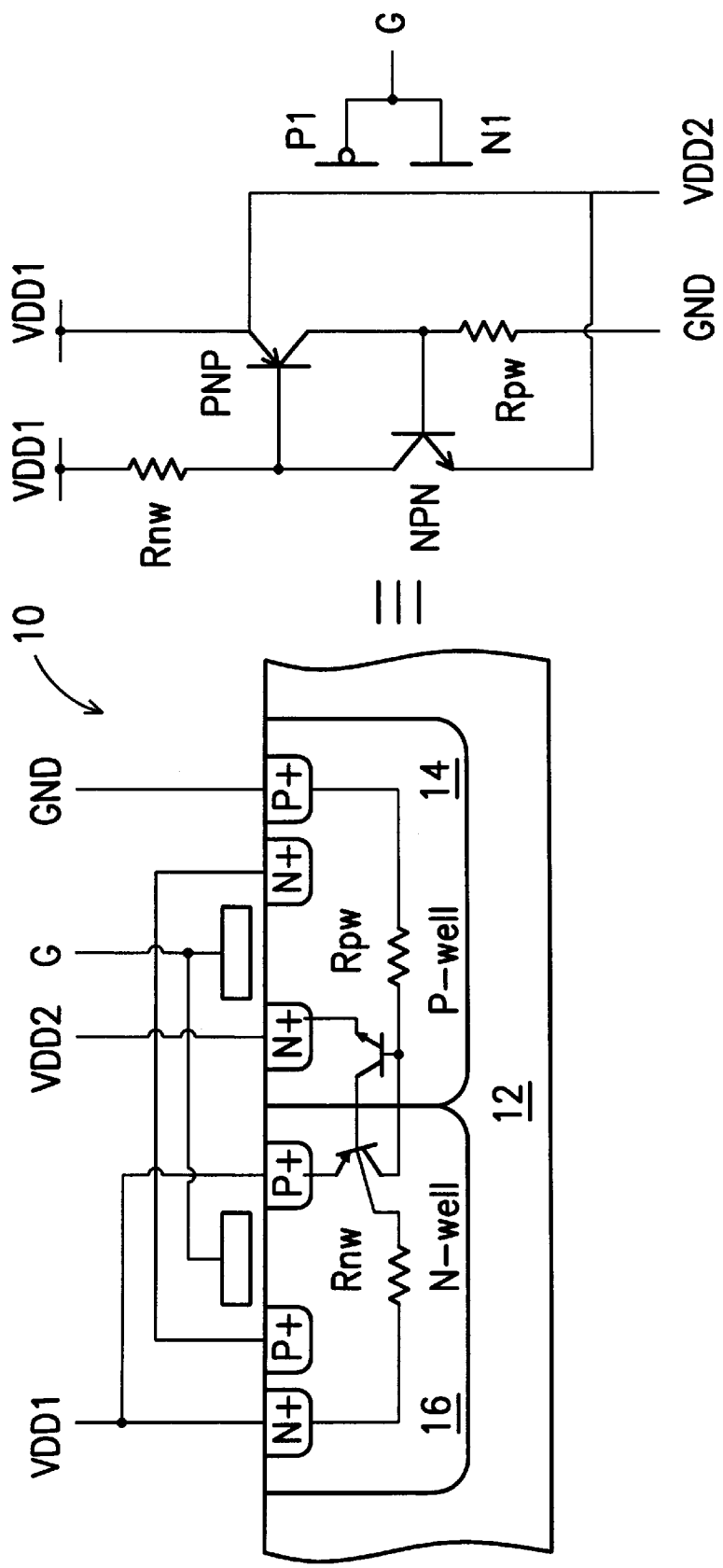
FIG. 2 is a sectional view of an ESD protection device according the invention.

FIG. 2 is a sectional view of an ESD protection device according the invention. In FIG. 2, the corresponding symbols are assigned. The ESD protection device 10 of the invention is fabricated on a semiconductor chip or a semiconductor substrate 12. The ESD protection device 10 comprises a N-type well 16, a P-type well 14, and a pair of PN MOS.

The N-type well 16 is adjacent to the P-type well 14. The N-type well 16 is coupled to a high power line VDD1 through a N+ doped area 18. The P-type well 14 is coupled to a low power line GND through a P+ doped area 28.

The pair of PN MOS in FIG. 2 comprises two field effect transistors (FET): one is a P-type metal-oxide-semiconductor field effect transistor (PMOS), P1, and the other is a N-type metal-oxide-semiconductor field effect transistor (NMOS), N1. P1 is installed in the N-type well 16, and N1 is installed in the P-type well 14. P1 has a gate structure to be a gate and placed between two P+ doped areas 20 and 22 functioning as a source and a drain. N1 also has a gate structure to be a gate and placed between two N+ doped areas 24 and 26 functioning as a source and a drain. The gates of P1 and N1 are coupled to each other, and the P+ doped area 20 and the N+ doped area 26 are coupled to each other. The P+ doped area 22 is coupled to VDD1, and N+ doped area 24 is coupled to another high power line VDD2. The pair of PN MOS represents an inverter powered by VDD1 and VDD2. The input end of the inverter is equivalent to the gates of P1 and N1, and the output end of the inverter is equivalent to the connected source/drains of P1 and N1.

As shown in FIG. 2, two parasitical bipolar junction transistors (BJT) are respectively formed under N1 and P1. The parasitical PNP BJT is composed of P+ doped area 22, N-type well 16 and P-type well 14. The parasitical NPN BJT is composed of N-type well 16, P-type well 14 and N+ doped area 24. An equivalent N-type well spread resistance Rnw is connected between the base of the PNP BJT and VDD1, and an equivalent P-type well spread resistance Rpw is connected between the base of the NPN BJT and VSS. The relationship among the connected elements in the sectional view is also shown in a symbol diagram in the right of FIG. 2. The combination of NPN BJT and PNP BJT forms a silicon controlled rectifier (SCR) having a PNPN structure, whose anode (P+ doped area 22) is coupled to VDD1 and whose cathode (N+ doped area 24) is coupled to VDD2.

In normal operation with normal power supplies, at lease one of the PMOS and the NMOS in the pair of PN MOS has to be turned off so as to prevent the unnecessary power consumption due to the constant leak current through the pair of PN MOS. A practical way is to couple both of the gates of the PMOS and NMOS to VDD1 or VDD2.

Figure 1:
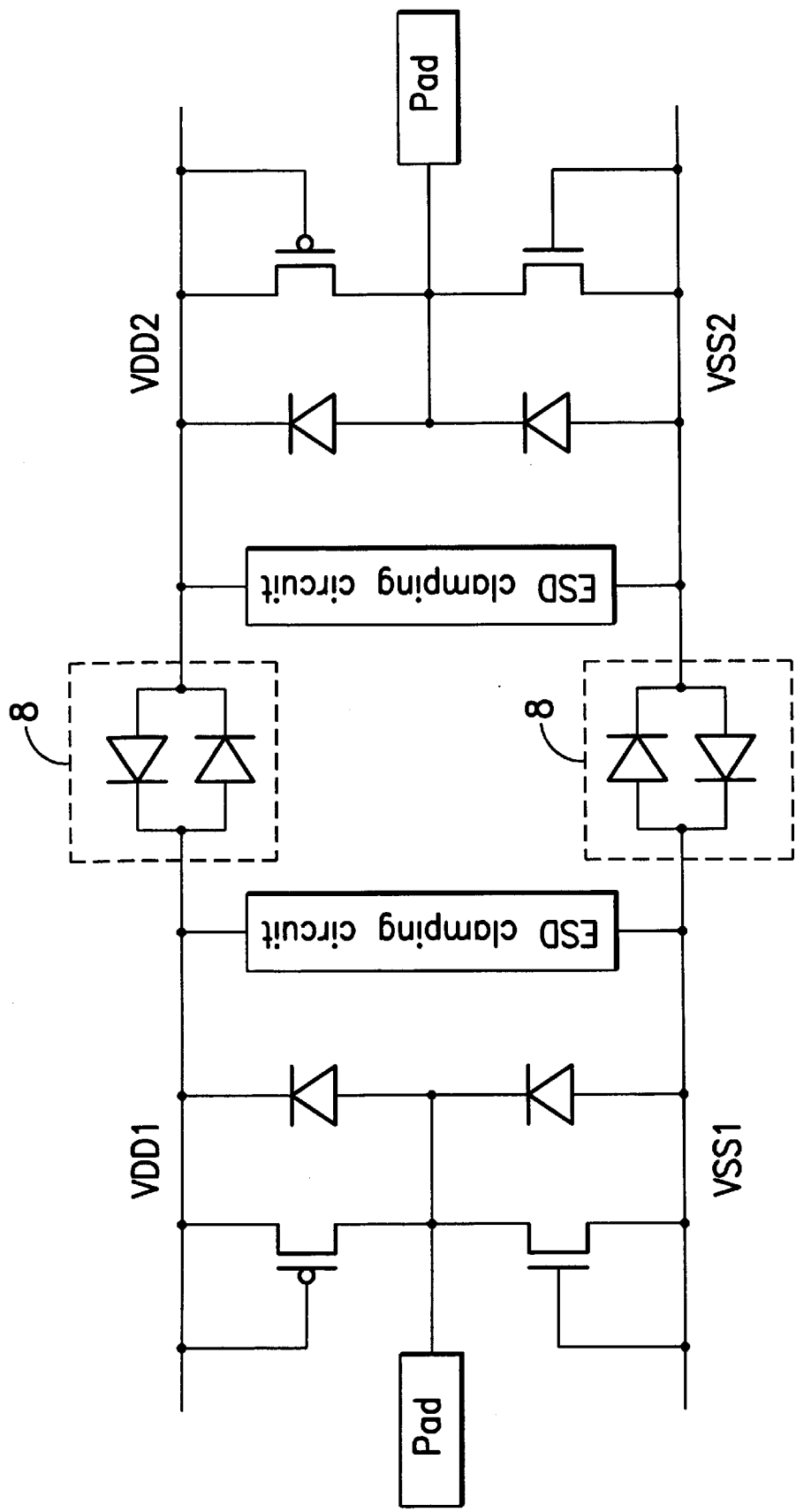
FIG. 1 is a perspective diagram of a prior art ESD protection system.
Figure 3:
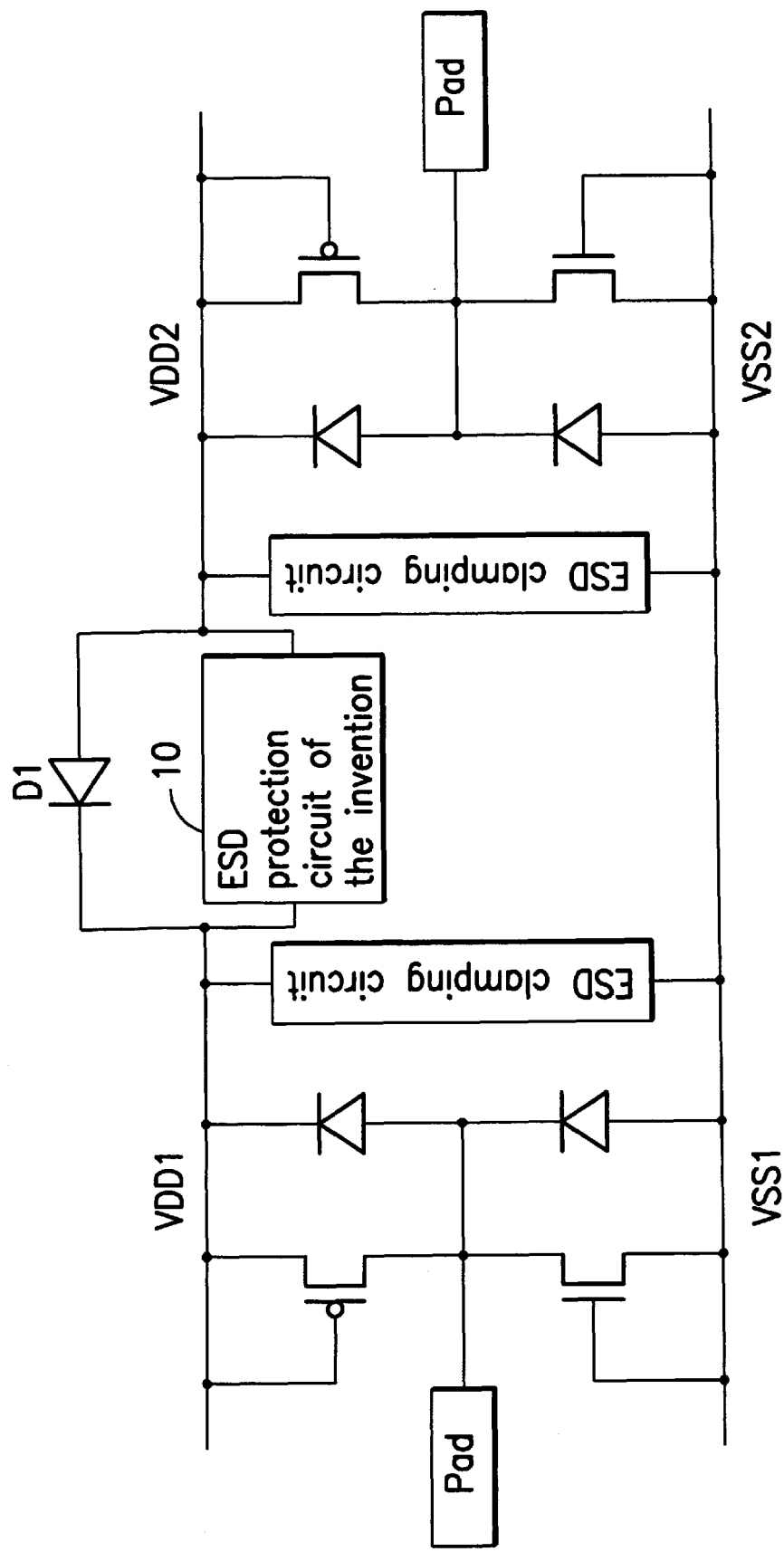
FIG. 3 shows the application of the ESD protection device of the invention.

The invention primarily relates to the ESD protection between the high power lines. Set that, in normal operation, the value of VDD1 is much greater than the value of VDD2. This will make it economically ineffective to serially connect the diodes to isolate VDD1 and VDD2. The ESD protection device 10 of the invention then can be used for providing the ESD protecting between the VDD1 and VDD2 so as to isolate VDD1 and VDD2. As shown in FIG. 3, for example, in the operation with a normal power source, the value of VDD1 is greater than that of VDD2 by 4 Volt. In the prior art such as the ESD protection system of FIG. 1, at least 6 diodes are required to be connected in series (0.7*6= 4.2>4). Compared with the prior art, by using the way of connecting shown in FIG. 3, only one ESD protection device of the invention is required. Actually, the ESD protection device of the invention only occupies an area as much as that occupied by two MOS and much smaller than that occupied by 6 diodes.

In normal operation (when powered by steady power sources), as long as the voltage difference between VDD1 and VDD2 is not greater than the value of the trigger voltage of the parasitical SCR in the ESD protection circuit of the invention, the SCR can provide a sufficient voltage barrier so as to isolate VDD1 and VDD2. The value of the trigger voltage of the SCR can be adjusted by changing the positions of the N+ doped area 18 and the P+ doped area 28, changing the concentration of the P+ doped area 22, and so on. All of these are well known by the persons skilled in ESD technology, and will not be explained.

When an ESD stress of a negative voltage occurs in VDD1 and VDD2 is grounded, the ESD current will pass through the diode D1 of FIG. 3 so that other elements will be protected.

When an ESD stress of a positive voltage occurs in VDD1 and VDD2 is grounded, the ESD current with very low equivalent resistance will pass through the parasitical turn-on SCR in the ESD protection circuit of the invention so that other elements will be protected.

Figure 4:
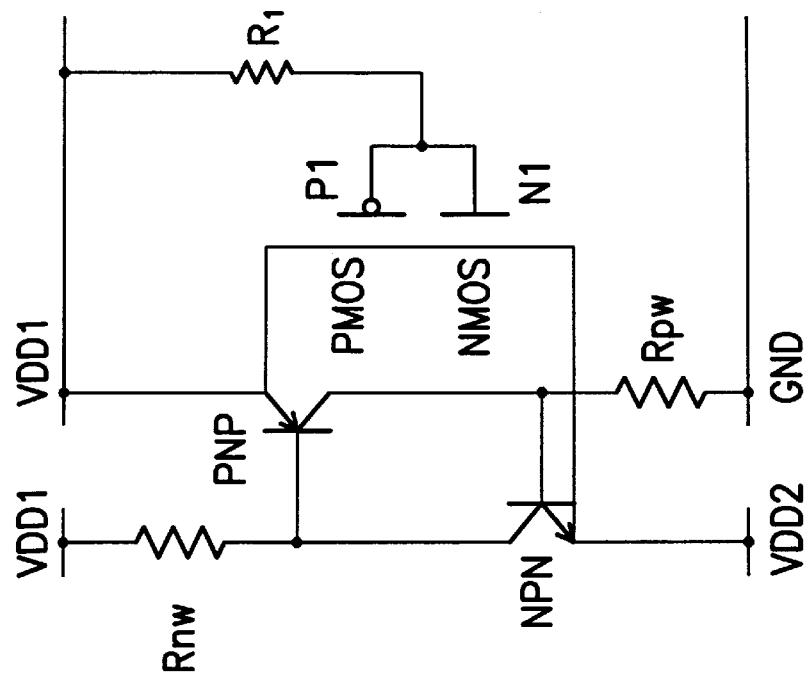
FIG. 4 is a perspective diagram of an ESD protection device of a first embodiment according to the invention.

FIG. 4 is a perspective diagram of an ESD protection device of a first embodiment according to the invention. The pair of PN MOS is coupled to VDD1 via a resistance R1 to ensure that P1 is turned off during normal operation.

Figure 5:
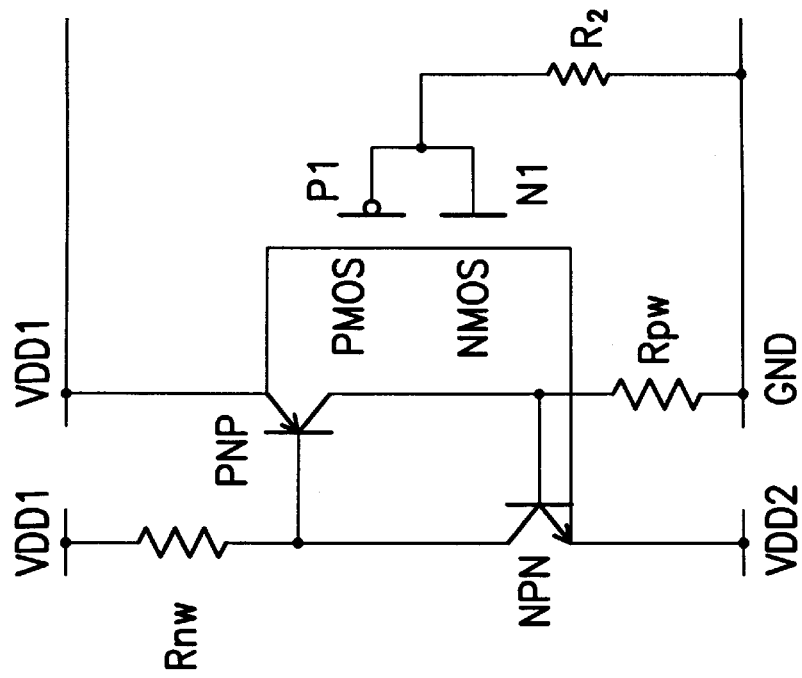
FIG. 5 is a perspective diagram of an ESD protection device of a second embodiment according to the invention.

FIG. 5 is a perspective diagram of an ESD protection device of a second embodiment according to the invention. The PN MOS is coupled to GND via a resistance R2 to ensure that N1 is turned off during normal operation.

Figure 6:
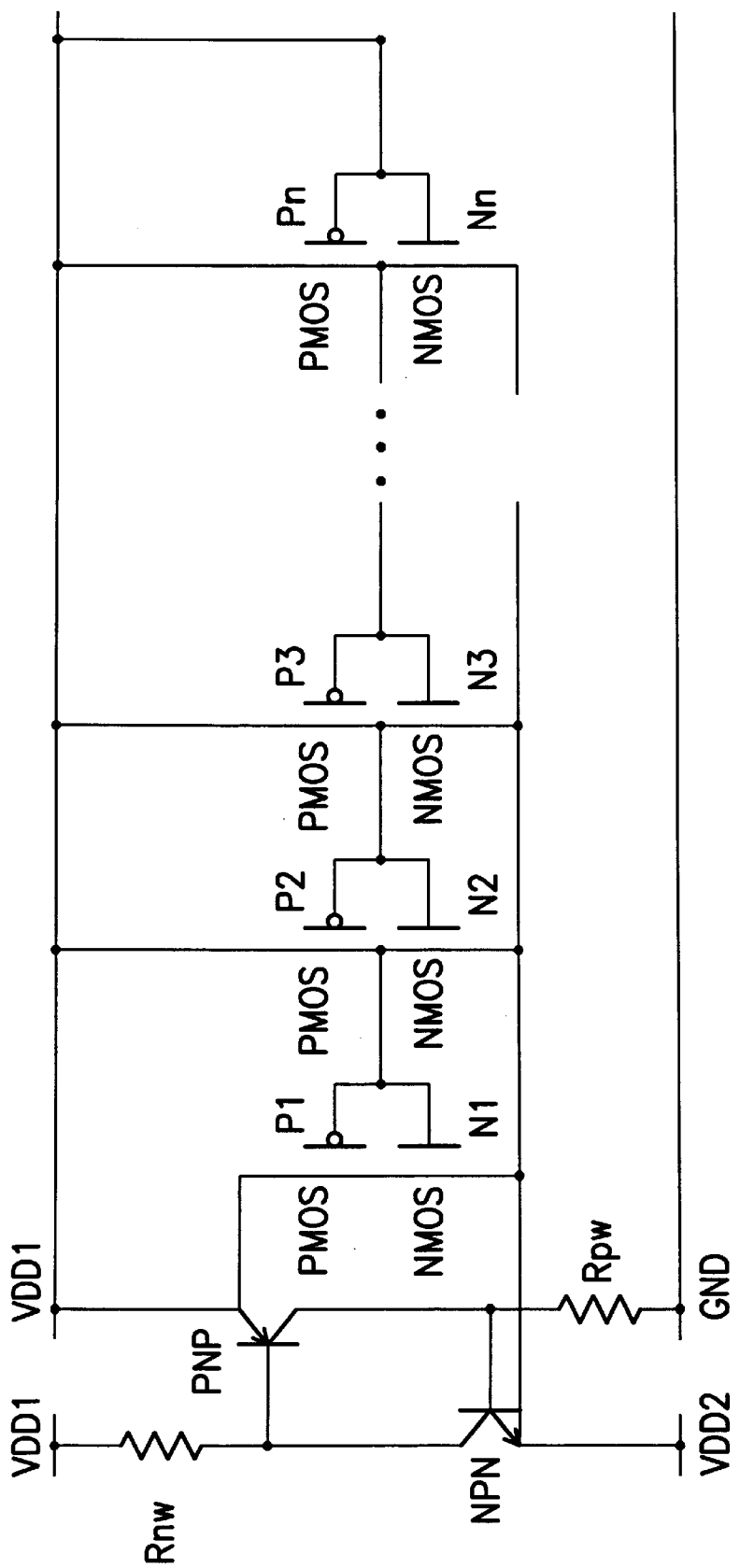
FIG. 6 is a perspective diagram of an ESD protection device of a third embodiment according to the invention.

FIG. 6 is a perspective diagram of an ESD protection device of a third embodiment according to the invention. The ESD protection device of the invention has a plurality of pairs of PN MOS connected in series. The gates of the NMOS and PMOS in each of the pairs of PN MOS are connected to each other for being an input end. The sources/drains of the NMOS and PMOS in each of the pairs of PN MOS are connected to each other for being an output end. Another source/drain of each PMOS is coupled to VDD1, and another source/drain of each NMOS is coupled to VDD2. The input end of the first pair of PN MOS, formed by Pn and Nn, is coupled to VDD1 or GND, as shown in FIG. 6.

In the operation with a normal voltage, the input end of the last pair of PN MOS, formed by the gates of P1 and N1, is coupled to VDD1 or VDD2 via P2 or N2. Therefore, P1 or N1 is always turned off.

In FIG. 6, when VDD2 is grounded and the ESD stress of the positive voltage occurs in VDD1, the input end of the last pair of PN MOS will be coupled to the ESD voltage of VDD1 via P2 or coupled to the ground voltage of VDD2 via N2 after a period of time is passed. In other word, the input end of the last pair of PN MOS will be at a floating status within the period of time following the occurrence of the ESD event. The persons skilled in the SCR technology will understand that a floating gate can efficiently accelerate the triggering speed of the parasitical SCR in MOS so as to promote the ESD level for the ESD protection circuit. Therefore, the ESD protection device of FIG. 6 has a better efficiency of ESD protection.

Figure 7:
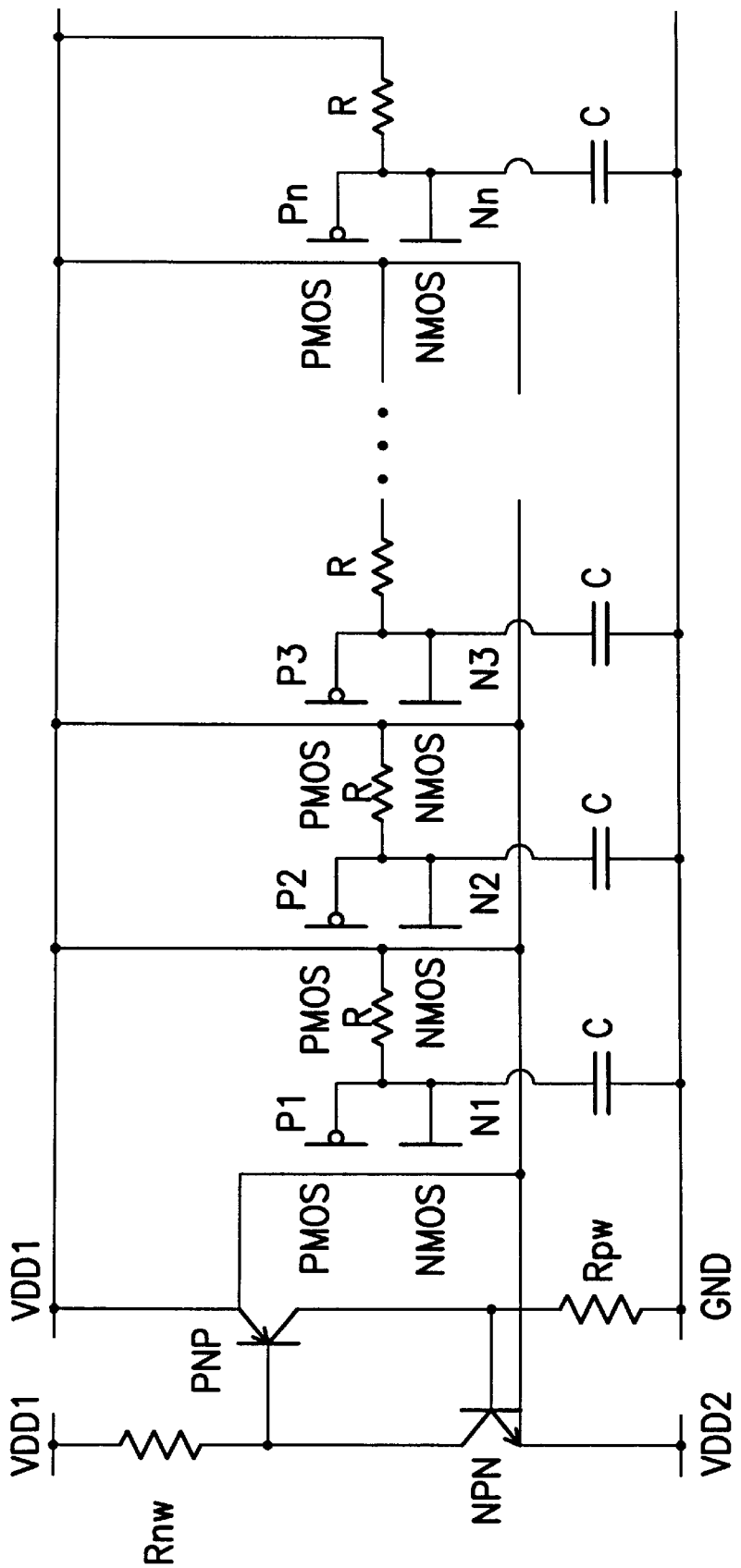
FIG. 7 is a perspective diagram of an ESD protection device of a fourth embodiment according to the invention.

FIG. 7 is a perspective diagram of an ESD protection device of a fourth embodiment according to the invention. In order to lengthen the period where the gate of the last pair of PN MOS is at the floating status, a RC delay circuit is connected between each two of the pairs of PN MOS, as shown in FIG. 7. A resistance is serially connected between each two of the pairs of PN MOS, and a capacitance is coupled between the input end and GND of each of the pairs of PN MOS. The input end of the first pair of PN MOS is coupled to VDD1 via a resistance.

Figure 8:
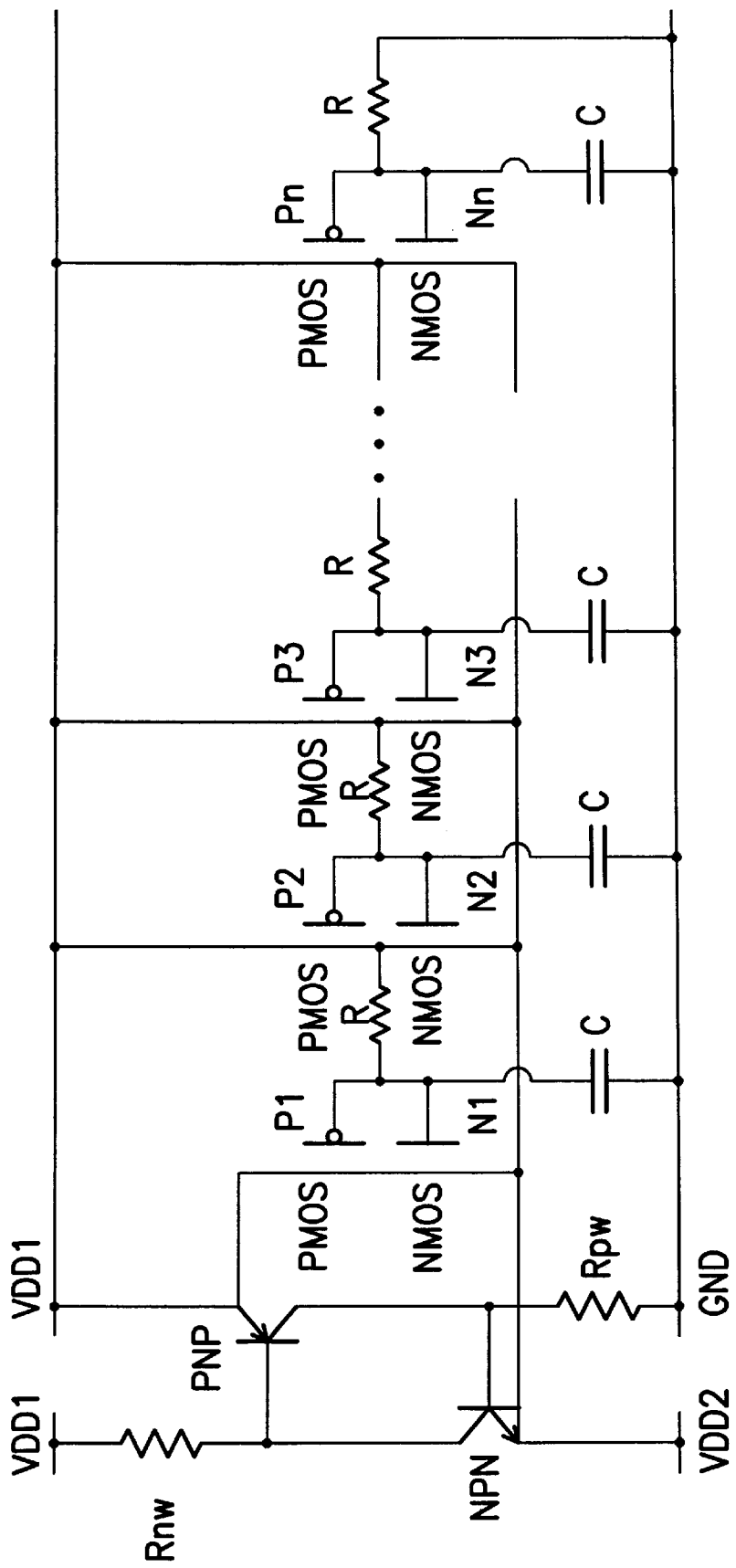
FIG. 8 is a perspective diagram of an ESD protection device of a fifth embodiment according to the invention.

FIG. 8 is a perspective diagram of an ESD protection device of a fifth embodiment according to the invention. Compared with FIG. 7, the input end of the first pair of PN MOS is coupled to GND via a resistance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrostatic discharge (ESD) protection device coupled between a first high power line and a second high power line, comprising:
   a N-type well and a P-type well adjacent to each other, the N-type well being coupled to the first high power line and the P-type well being coupled to a low power line; and a pair of PN MOS comprising:
      a P-type metal-oxide-semiconductor transistor (PMOS) installed in the N-type well, comprising a first gate structure, a first P-type doped area and a second P-type doped area, the first gate structure being a gate of the PMOS and the first P-type doped area being coupled to the first high power line; and
      a N-type metal-oxide-semiconductor transistor (NMOS) installed in the P-type well, comprising a second gate structure, a first N-type doped area and a second N-type doped area, the second gate structure being a gate of the NMOS, wherein the gate of the NMOS is coupled to the gate of the PMOS so as to form an input end of the pair of PN MOS, the second P-type doped area is coupled to the second N-type doped area so as to from an output end of the pair of PN MOS, and the first N-type doped area is coupled to the second high power line;
   wherein in a normal operation, either the PMOS or the NMOS is turned off.

2. The ESD protection device of claim 1, wherein the first P-type doped area and the first N-type doped area are located between the first and the second gate structures.

3. The ESD protection device of claim 1, wherein the voltage of the first high power line is higher than the voltage of the second high power line.

4. The ESD protection device of claim 1, wherein the input end of the pair of PN MOS is coupled to the first high power line or the low power line.

5. The ESD protection device of claim 4, wherein the input end of the pair of PN MOS is coupled to the first high power line or the low power line via a resistance.

6. The ESD protection device of claim 1, wherein the ESD protection device further comprises a plurality of pairs of PN MOS connected in series, and an input end of a first pair of PN MOS is coupled to the first high power line or the low power line.

7. The ESD protection device of claim 6, wherein a resistance is serially connected between each two of the pairs of PN MOS, and a capacitance is coupled between the input end of each of the pairs of PN MOS and the low power line.

8. The ESD protection device of claim 6, wherein the input end of the first pair of PN MOS is coupled to the first high power line or the low power line via a resistance.

9. An electrostatic discharge protecting device coupled between a first high power line and a second high power line, comprising:
   a N-type well and a P-type well adjacent to each other, the N-type well being coupled to the first high power line and the P-type well being coupled to a low power line; and
   a plurality of pairs of PN MOS connected in series, each of the pairs of PN MOS comprising:
      a P-type metal-oxide-semiconductor transistor (PMOS) installed in the N-type well, comprising a first gate structure, a first P-type doped area and a second P-type doped area, the first gate structure being a gate of the PMOS and the first P-type doped area being coupled to the first high power line; and
      a N-type metal-oxide-semiconductor transistor (NMOS) installed in the P-type well, comprising a second gate structure, a first N-type doped area and a second N-type doped area, the second gate structure being a gate of the NMOS, wherein the gate of the NMOS is coupled to the gate of the PMOS so as to form an input end, the second P-type doped area is coupled to the second N-type doped area so as to form an output end, the first N-type doped area is coupled to the second high power line;
   wherein in normal operation, either the PMOS or the NMOS is turned off;
   wherein an input end of an first pair of PN MOS is coupled to the first high power line or the low power line.

* * * * *